United States Patent
Wei et al.

(10) Patent No.: US 6,301,318 B1
(45) Date of Patent: Oct. 9, 2001

(54) PIPELINED PHASE DETECTOR FOR CLOCK RECOVERY

(75) Inventors: Fangxing Wei, Chandler; Tadeusz Kwasniewski, Ottawa, both of (CA)

(73) Assignee: PMC-Sierra Ltd., Burnaby (CA)

( * ) Notice: Subject to any disclaimer, the term of this patent is extended or adjusted under 35 U.S.C. 154(b) by 0 days.

(21) Appl. No.: 09/050,122

(22) Filed: Mar. 30, 1998

(51) Int. Cl.$^7$ .............. H04L 7/00; H04L 25/00; H04L 25/40

(52) U.S. Cl. .............................. 375/371; 327/3

(58) Field of Search .................. 375/224, 371, 375/373, 375, 376; 327/2, 3, 7, 12, 211, 212, 218

(56) References Cited

U.S. PATENT DOCUMENTS 5,164,966 * 11/1992 Hershberger .
5,485,484 * 1/1996 Williams et al. .................... 375/376
5,619,148 * 4/1997 Guo ......................................... 327/3

* cited by examiner

*Primary Examiner*—Chi Pham
*Assistant Examiner*—Jean B. Corrielus
(74) *Attorney, Agent, or Firm*—Harold C. Baker; Robert A. Wilkes; Robert G. Hendry

(57) ABSTRACT

A method of phase detecting a data input NRZ signal comprises applying the input data signal to a pair of parallel channels each comprising the same phase delay, and each clocked using the same clock signal. The phase delayed input data signal is coupled to respective inputs of a pair of phase comparators. The input data signal is coupled to a further channel comprising the same phase delay, and the further channel is clocked using the same clock signal. The phase delayed input signal is passed from the further channel through a further delay which is a fraction of that same phase delay, and the further delay is clocked using the clock signal. The further delayed input data signal is applied to another input of one of the phase comparators. The input data signal is applied through another phase delay which has the fraction of the aforenoted same phase delay (but is unclocked), to another input of the other of the phase comparators. Output signals are obtained from each of the phase comparators.

13 Claims, 5 Drawing Sheets

PIPELINED PHASE DETECTOR FOR CLOCK RECOVERY

FIELD OF THE INVENTION

This invention relates to the field of clock recovery systems, and in particular to a phase detector that can be used in a clock recovery system.

BACKGROUND TO THE INVENTION

Phase/frequency detectors are typically used in phase locked loops in clock recovery systems. A clock recovery system is used to recover a clock signal from a data stream which has passed along a data transmission system, for example between a transmitter and a receiver, each of which can be comprised of an integrated circuit.

A schematic of a well known phase/frequency detector, called a Hogge phase detector is shown in FIG. 1. This structure is comprised of a pair of static D-type flip flops 1 and 2, flip flop 1 having its Q output connected to an input of an exclusive OR (XOR) gate 3, and flip flop 2 having its Q output connected to an input of an XOR gate 4. An input data signal is applied to the D input of flip flop 1 as well as to the other input of XOR gate 3, and a clock signal CLOCK is applied to the clock input of flip flop 1. A complementary clock signal/CLOCK is applied to the clock input of flip flop 2. The Q output of flip flop 1 is also connected to the second input of XOR 4 as well as to the D input of flip flop 2.

The function of the circuit is to compare the input non-return-to-zero (NRZ) data signal to the clock signal. In operation, when the positive edge of the recovered clock is aligned to the center of the data eye, then DC components of pulse signals A and B which are presented at the A and B outputs of the XORs are equal (i.e. both the positive and negative excursions of the NRZ output signals are equal, and the time periods of these excursions are equal).

When the positive edge of the recovered clock signal is delayed with respect to the center of the data eye, then the DC component of the signal A is greater than B. When the positive edge of the recovered clock is advanced with respect to the center of the data eye, the DC component of the signal A is smaller than B.

The output signals A and B can be used to drive a charge pump. Since the DC values of signals A and B contain information about the relationship between the clock and the data, the outputs can be coupled to a voltage or current up-down generator which drives a voltage or current controlled oscillator, which is contained in a loop with a loop filter and optionally a divider, to form a phase locked loop system.

This design requires both a clock and a complementary clock signal to drive the two flip flops 1 and 2. Any skew between these clock signals creates problems in high-speed applications. In particular, random delay can create a large dead zone and reduce linearity. Difficulty in high speed operation is a major shortcoming of the above design. The maximum operating frequency of the static Hogge detector constructed using a 0.35 $\mu$m CMOS process has been shown to be about 300 Mb/s, and about 250 Mb/s using a 0.8 $\mu$m CMOS process.

SUMMARY OF THE PRESENT INVENTION

In contrast to the Hogge design, the present invention can function in high speed applications (e.g. in which data rates are in excess of 500 Mb/s). It needs only a single clock signal, i.e. no complementary clock signal, and therefore the skew problem observed in the Hogge design does not exist. Further, the present invention can be made using well established CMOS processes. It also recovers NRZ data signals without requiring prior or intermediate conversion to RZ (return-to-zero) data signals.

The preferred embodiment of the present invention uses a pipeline architecture which includes true single phase clock (TSPC) latches. The pipeline architecture provides a detector which is less sensitive to random delays, by making the signal travel with the same delay in all signal channels. As a result, a high operating frequency which is approximately twice that of the Hogge detector has been shown to be achievable.

In accordance with an embodiment of the present invention a method of phase detecting a data input NRZ signal comprises applying the input data signal to a pair of parallel channels each comprising the same phase delay, and each clocked using the same clock signal. The phase delayed input data signal is coupled to respective inputs of a pair of phase comparators. The input data signal is coupled to a further channel comprising said same phase delay, and the further channel is clocked using said same clock signal. The phase delayed input signal is passed from the further channel through a further delay which is a fraction of that same phase delay, and the further delay is clocked using the clock signal. The further delayed input data signal is applied to another input of one of the phase comparators. The input data signal is applied through another phase delay which has the fraction of the aforenoted same phase delay (but is unclocked), to another input of the other of the phase comparators. Output signals are obtained from each of the phase comparators.

Preferably each fraction of the same phase delay is obtained by passing a signal applied to it through a true single phase clock (TSPC) latch. Preferably each input signal is delayed by the predetermined time by passing the input signal through respective flip flops, each of which is comprised of a series of TSPC latches.

In accordance with another embodiment of the present invention a phase detector comprises:

(a) first and second exclusive OR (XOR) gates, each having a pair of inputs, (b) a pair of dynamic D-type flip-flops, each having a data input for receiving the same data input signal, and each having a clock input for receiving the same clock input signal, an output of each of the flip flops being coupled to a corresponding input of a corresponding XOR gate, (c) a first and a second latch, each having a data input, a clock input and an output, apparatus for coupling the data input signal to the data input of the first latch and apparatus for coupling the clock signal to the clock input of the second latch, apparatus for coupling a fixed voltage to the clock input of the first latch, the output of the first latch being coupled to another input of the first XOR gate and the output of the second latch being coupled to another input of the second XOR gate, (d) a third dynamic D-type flip-flop comprising a data input for receiving the data input signal, a clock input for receiving the clock signal, and an output coupled to the data input of the second latch, and (e) apparatus for providing output signals at outputs of the XOR gates.

In accordance with another embodiment of the invention, a method of phase detecting a data input NRZ signal comprises:

(a) applying the data input signal to respective data inputs of a pair of dynamic D-type flip-flops, (b) applying a clock input signal to respective clock inputs of the pair of the dynamic D-type flip-flops, (c) applying the data input signal to a data input of a first latch, and applying a fixed voltage to a clock input of the first latch, (d) coupling the clock input signal to the clock input of a second latch, (e) applying the data input signal to a data input of a third dynamic D-type flip-flop, (f) coupling the clock signal to a clock input of the third dynamic D-type flip flop, (g) coupling an output of the third dynamic D-type flip flop to the data input of the second latch, (h) coupling an output of each of the flip flops to a corresponding input of a corresponding first and second XOR gate, (i) coupling he output of the first latch to another input of the first XOR gate and coupling the output of the second latch to another input of the second XOR gate, and (j) providing output signals at outputs of the XOR gates.

BRIEF DESCRIPTION OF THE DRAWINGS

A better understanding of the invention will be obtained by a consideration of the detailed description below, in conjunction with the following drawings, in which.

DETAILED DESCRIPTION OF EMBODIMENTS OF THE INVENTION

Figure 2:
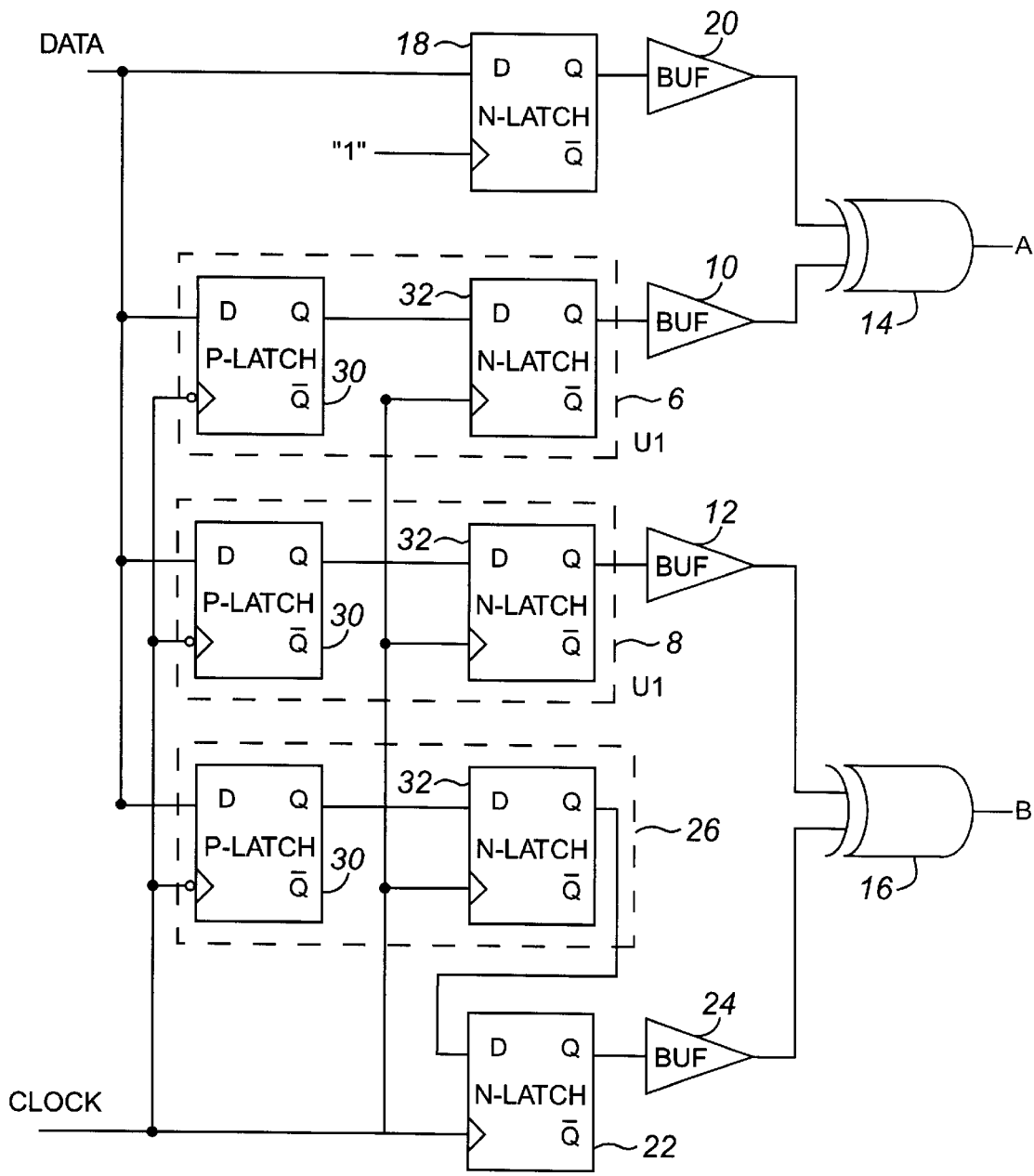
FIG. 2 is a schematic diagram of an embodiment of the present invention.

Turning to FIG. 2, an NRZ input data signal is applied to data inputs of a pair of dynamic edge triggered D-type flip flops 6 and 8 each preferably formed of a cascade of a TSPC (true single phase clock) p-latch and a TSPC n-latch. A clock signal CLOCK is applied to the clock inputs of the flip flops 6 and 8. Q outputs of flip flops 6 and 8 are coupled via buffers 10 and 12 to corresponding inputs of respective XOR gates 14 and 16 respectively.

The input data signal is also applied to the D input of a TSPC latch 18, the Q output of which is coupled via buffer 20 to the other input of XOR 14. A "1" logic level signal is applied to clock input of latch 18, so that it will merely pass data input signals applied to it with a time delay.

The clock signal CLOCK is also applied to the clock input of a TSPC latch 22, the output of which is coupled via buffer 24 to the other input of XOR 16.

The input data signal is also applied to the D input of another dynamic flip flop 26 (which is preferably formed similarly to flip flops 6 and 8, and the signal CLOCK is applied to dynamic flip flop 26. The Q output of flip flop 26 is connected to the data input of latch 22.

Figure 3:
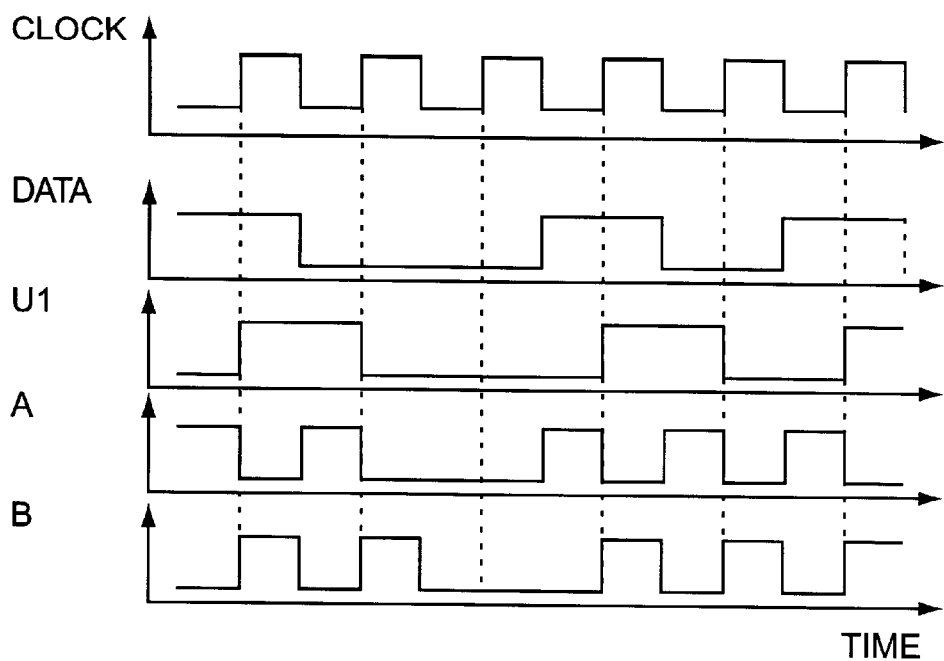
FIG. 3 is a timing diagram of signals in the circuit of FIG. 2, with the clock and data signals aligned, FIG. 4 a timing diagram of signals in the circuit of FIG. 2, with the clock signal ahead of the data signal.
Figure 4:
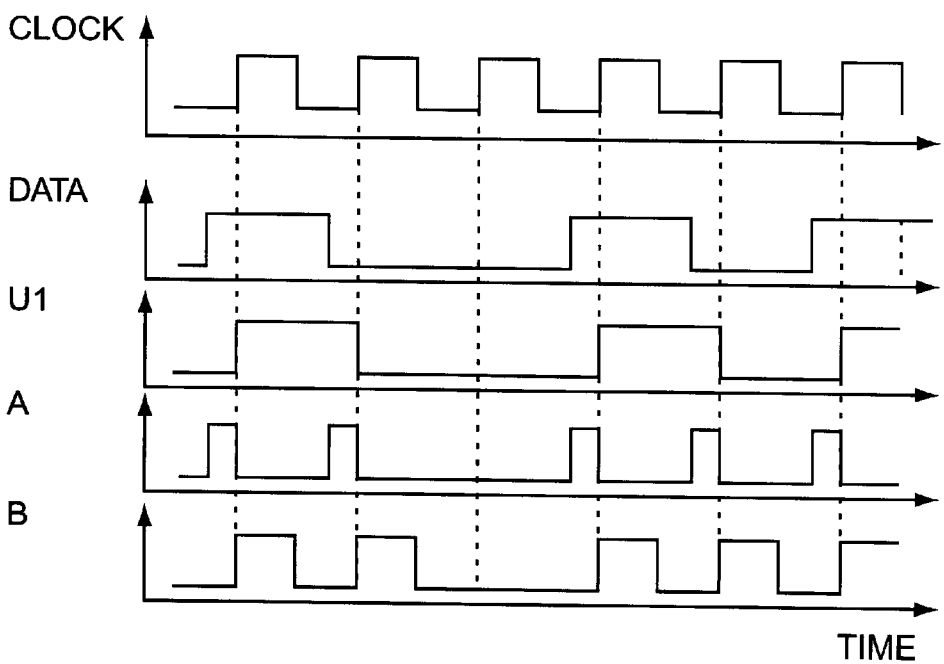

Operation of the circuit may be understood with reference to the timing diagrams shown in FIGS. 3 and 4. FIG. 3 shows the clock and data signals aligned, and FIG. 4 shows the clock signal ahead of the data signal.

The input data signal is delayed equally by flip flops 6, 8 and 26, through which they are clocked using the same clock signal. The outputs of flip flops 6 and 8 are applied to respective inputs of XOR gates 14 and 16 (which operate as phase detectors of these signals with respect to signals applied to their other inputs) via buffers 10 and 12. The input signal which is delayed in flip flop 26 the same amount as in flip flops 6 and 8, is further phase delayed in clocked n-latch 22 by a fraction of the phase delay in flip flop 26, and is applied via buffer 24 to another input of XOR 16. The input signal, phase delayed in unclocked n-latch 18 (which provides an equal phase delay as n-latch 22), is applied via buffer 20 to another input of XOR 14.

Thus the clocked delayed input signal is compared with the input signal in XOR 16. The clocked delayed input signal places the clock leading edge into the eye of the input signal. The unclocked delayed input signal is compared with the input signal in XOR 14. This places the clock leading edge somewhere relative to the center of the eye of the input signal, depending on their relative phases. If the unclocked delayed input signal is exactly at the same time as the clocked input signal, the outputs of each XOR circuit will be the same. However, if it is not, the positive and negative excursions of the A and B outputs of the respective XOR circuits will be different. The positive and negative excursions will be the same, i.e. the clock will be exactly at the center of the eye of the input signal, if the time delay of each of the p- and n-latches is the same, i.e. the time of each of the n-latches 18 and 22 is half the time delay of each of flip-flops 6, 8 and 26.

Assuming that the signals are aligned, it may be seen that the data signal has its rising and trailing edges at the same time as rising and trailing edges of the clock. At the time of the first rising clock edge shown, the data signal is of high logic level. Thus all of the three flip flops 6, 8 and 26 are enabled to carry a high. The outputs U1 of each of flip flops 6 and 8 go high as shown in FIG. 3, and remain high until the next rising edge of the clock signal that coincides with the data signal having gone low. The output of flip flop 26 also goes high for the same period as flip flops 6 and 8, and presents those logic levels to the data input of latch 22.

The output logic level signals of flip flops 6 and 8 are coupled to inputs of corresponding XORs 14 and 16. The data signal is also applied to unclocked latch 18. The inverse logic level of latch 18 is output from clocked latch 22 (due to inversion of the input signal in flip flop 26 being applied to latch 22 ). The output signals of latches 18 and 22 are coupled to respective XORs 14 and 16 which output signals as shown in FIG. 3 as signals A and B. The signal A is low when both the clock signal and data signal are either high or low, and if they are different, A is high. The signal B is high or low, following the clock signal, unless there has been no immediately preceding data high. A truth table showing the relationship follows below, wherein H represents high logic level and L represents low logic level.

| Clock | Data | U1 | A | B |
|-------|------|----|----|----|
| H | H | H | L | H |
| L | L | H | H | L |

-continued

| Clock | Data | U1 | A | B |
|-------|------|----|----|----|
| H | L | L | L | H |
| L | L | L | L | L |
| H | L | L | L | L |
| L | H | L | H | L |

In the case of FIG. 3, the pulse widths of signals A and B may be seen to be equal, which means that the phase error is zero, and the clock has the correct phase in the center of the eye of the input data signal.

On the other hand, in FIG. 4 the data signal leads the clock signal. While the output signals U1 of flip flops 6 and 8 are the same as in FIG. 3, the signals A and B of FIG. 4 also follow the above truth table. It may be seen that the high logic level pulse width of signal A is narrower than its low level pulse width as compared to the pulse width of signal B, and it thus has a negative average value. This can be used in a voltage controlled oscillator to slow it down until the clock aligns with the data.

Figure 5A:
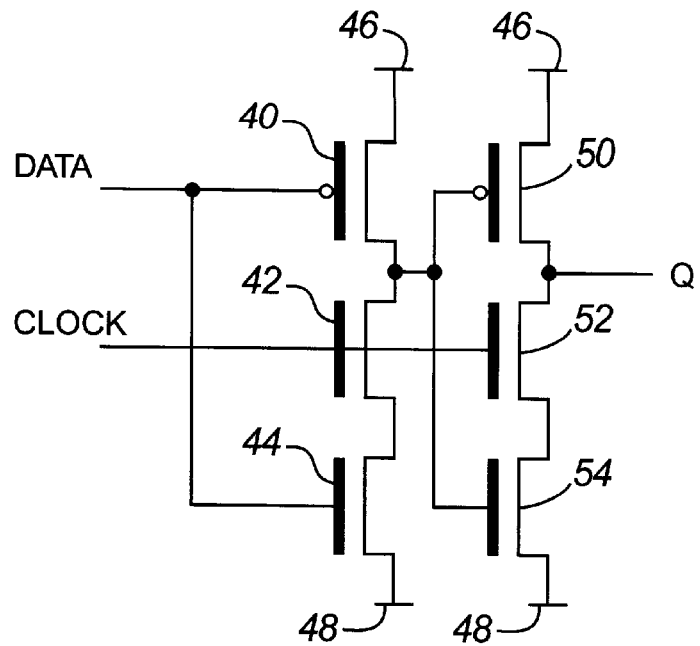
FIGS. 5A and 5B are schematic diagrams of two forms of n-latches.
Figure 5B:
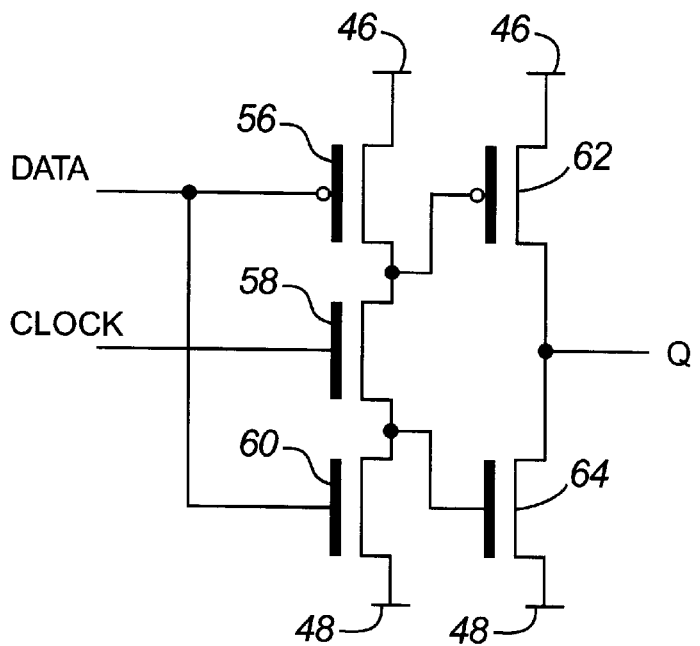
Figure 5C:
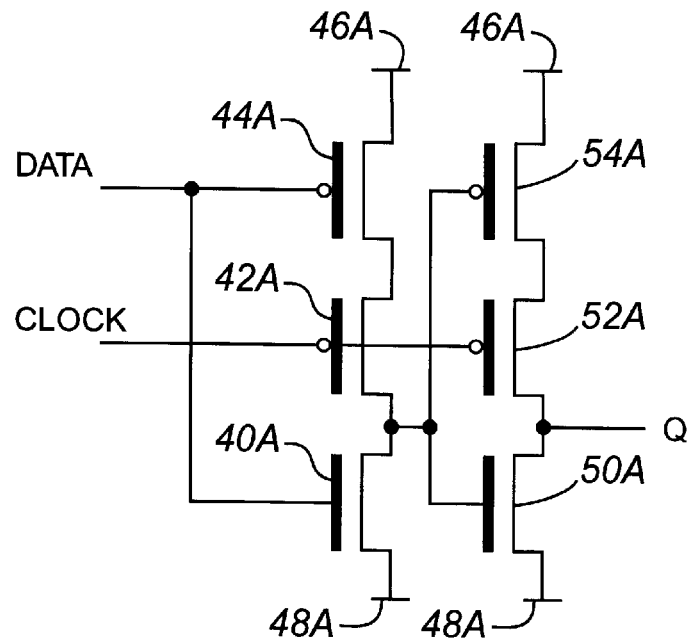
FIGS. 5C and 5D are schematic diagrams of two forms of p-latches.
Figure 5D:
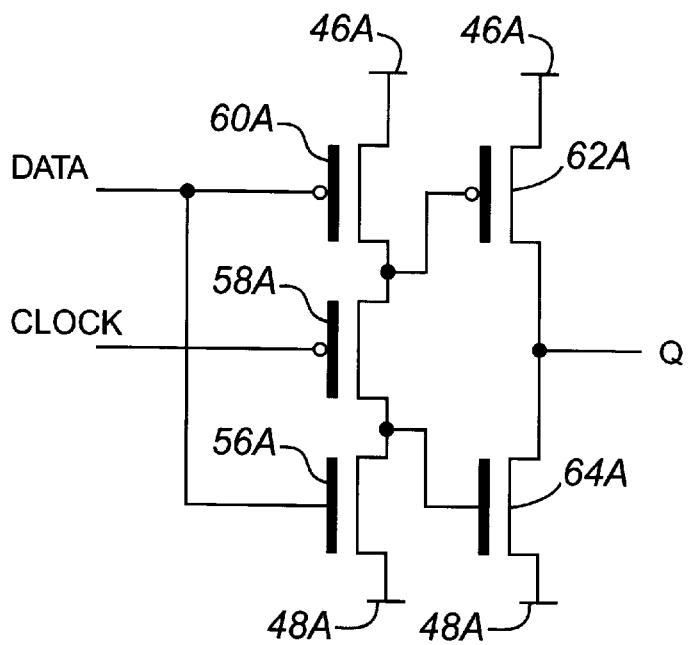

It is preferred that the dynamic flip flops should be of positive edge triggered type, formed by cascade configurations of pairs of TSPC p-latches 30 and TSPC n-latches 32. Two designs of n-latches are shown in FIGS. 5A and 5B, and two designs of p-latches are shown in FIGS. 5C and 5D. The use of the TSPC n- and p-latches is preferred, since they further speed up the detector operation dynamic logic circuits.

Turning to FIG. 5A, in one CMOS circuit the source-drain circuits of a p-channel FET 40 and two n-channel FETs 42 and 44 are connected in series between opposite polarity power supply rails 46 and 48. The drain of FET 40 is connected to rail 46 and the source of FET 44 is connected to rail 48.

In another CMOS circuit the source-drain circuits of a p-channel FET 50 and two n-channel FETs 52 and 54 are connected in series between the opposite polarity power supply rails 46 and 48. The drain of FET 50 is connected to rail 46 and the source of FET 54 is connected to rail 48.

The junction between FETs 40 and 42 is connected to the gates of FETs 46 and 54. The data input to the n-latch is connected to the gates of FETs 40 and 44, and the clock input to the n-latch is connected to the gates of FETs 42 and 52. The Q output of the n-latch is connected to the junction between FET 50 and FET 52.

As the clock alternates between high and low logic levels, FETs 42 and 52 alternate between being conductive and non conductive, depending on the conductive status of FETs 40, 44, 50 and 54. The status depends on the logic level of the data signal which enables FETs 40 and 44 to be conductive or nonconductive together. The resulting conductivity state is transferred to the gates of FETs 50 and 54 which become conductive or nonconductive with the power supply voltage presented to the gates of FETs 46 and 54 due to the conductivity of FET 40, and FETs 42 and 44. The resulting logic level resulting from FET 46, and FETs 52 and 54, is applied to the Q output, either via FET 50 conducting to power rail 46, or FETs 52 and 54 conducting to the opposite polarity power rail.

In the embodiment of FIG. 5B, p-channel FET 56 and two n-channel FETs 58 and 60 have their source-drain circuits connected similarly to FETs 40, 42 and 44, between power rails 46 and 48. However, the second CMOS circuit is instead comprised of p-channel FET 62 and n-channel FET 64, which have their source-drain circuits connected in series between power rails 46 and 48, with the drain of FET 62 connected to power rail 46 and the source of FET 64 connected to power rail 48.

The junction between FET 56 and 58 is connected to the gate of FET 62, and the junction between FET 58 and FET 60 is connected to the gate of FET 64. An output Q is connected to the junction between FETs 62 and 64.

The data input is connected to the gates of FETs 56 and 60, and the clock input is connected to the gate of FET 58.

In operation, the first CMOS circuit of FIG. 5B operates similarly to the first CMOS circuit of FIG. 5A. That is, FETs 56 and 60 are enabled or are inhibited together, with the logic level of the input data signal. FET 58 operates or is inhibited according to the logic level of the clock signal. Corresponding high or low logic levels resulting from operation of FETs 56 and 60, and 58 are transferred to the gates of FETs 62 and 64, which operate together or are inhibited to cause one or the other polarity levels of the power rails to be applied to output Q.

FIG. 5C illustrates an embodiment of a p-latch. The circuit is similar to that of FIG. 5A, but with p-channel FETs replacing the n-channel FETs, and the circuit inverted with respect to the power rails to which the FETs are connected. The corresponding FETs in FIG. 5C have been labelled similarly to those in FIG. 5A, but with an "A" suffix. The mode of operation is similar to that of FIG. 5A and a detailed explanation would be redundant to a person skilled in the art having read the description abovewith respect to FIG. 5A.

FIG. 5D illustrates another embodiment of a p-latch. The circuit is similar to that of FIG. 5B, but with p-channel FETs replacing the n-channel FETs in the first CMOS circuit, and being inverted with respect to the power rails to which those FETs are connected. The corresponding FETs in FIG. 5D have been labelled similarly to those in FIG. 5B, but with an "A" suffix. The FETs of the second CMOS circuit in FIG. 5D is similar to that of FIG. 5B, and have been similarly labelled. The principles of operation are similar to those of FIG. 5A, and a detailed explanation would be redundant. The reader is referred to the description of operation of FIG. 5B.

The present invention can be implemented using any reasonable combination of the circuits shown in FIGS. 5A, 5B, 5C, 5D, or with other elements which would perform a similar function.

A comparison between a dynamic and static edge triggered flip flops was made, wherein the dynamic flip flop was formed of the n-latch and p-latch configuration described herein. The comparison is tabulated below, wherein $t_{13}$dly_H is the propagation delay of the signal as it changes from low to high logic level, t_dly_L is the propagation delay as is changes from high to low, trise is the rise time and tfall is the fall time. The results were take from simulations using 0.35 CMOS technology parameters.

|  | Static Flip Flop | Dynamic Flip Flop |
|---|---|---|
| T dly H | 313 ps | 124 ps |
| T dly L | 288 ps | 96 ps |
| Trise | 108 ps | 93 ps |
| Tfall | 69 ps | 73 ps |

It may be seen that the propagation time delays and the rise time of the dynamic flip flop as described in this specification are considerably improved over those of a static flip flop as in the prior art, and the fall time was only about 6% slower.

Figure 1:
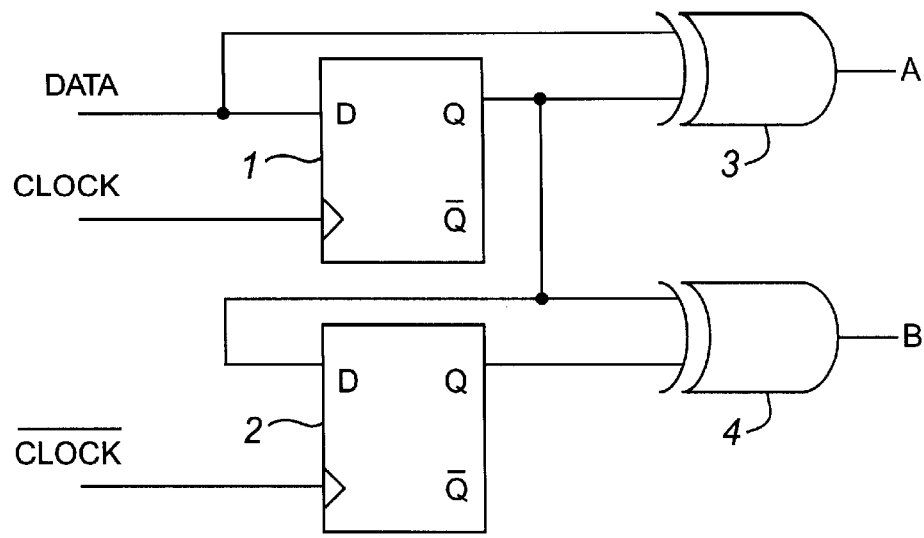
FIG. 1 is a schematic diagram of a phase detector in accordance with the prior art.
Figure 6:
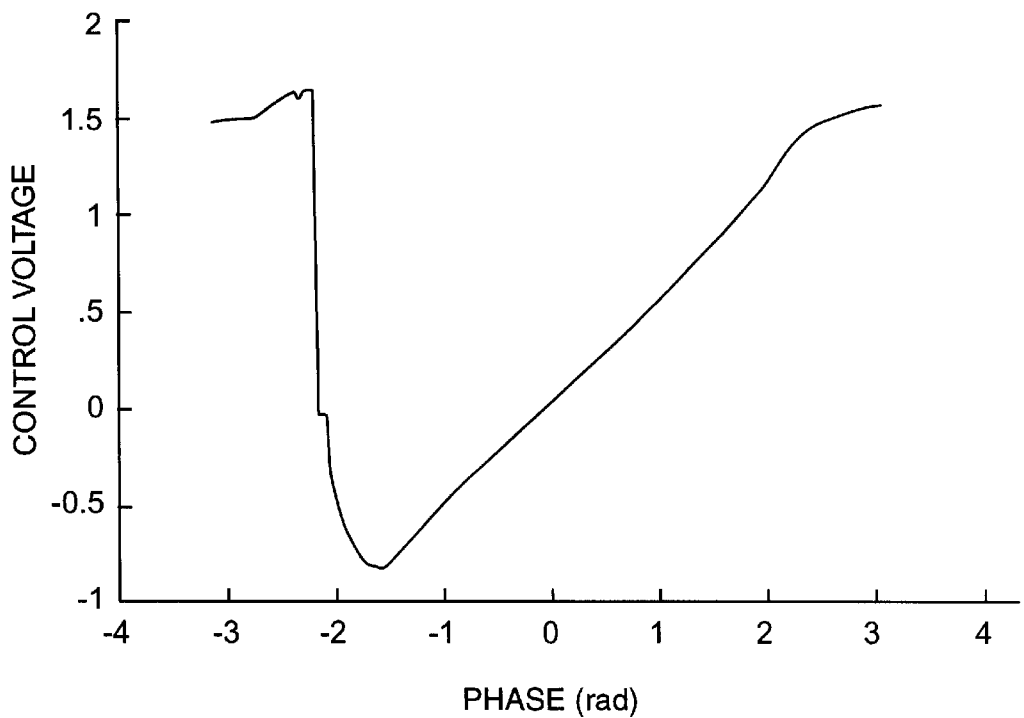
FIG. 6 is a plot of the average voltage between signals at outputs A and B of FIG. 2, and the phase difference between the data signal and the clock signal.

A plot of the phase difference vs control voltage is shown in FIG. 6. The control voltage is defined as the average voltage between outputs A and B. It may be seen that the phase detector is substantially linear between $-\pi/2$ and $\pi/2$ radians, which is adequate for phase locked loop applications. It will also be noted that the phase detector does not have a dead zone where the phase difference is close to zero.

A person understanding this invention may now conceive of alternate embodiments and enhancements using the principles described herein. All such embodiments and enhancements are considered to be within the spirit and scope of this invention as defined in the claims appended hereto.

We claim:

1. A method of phase detecting a data input NRZ signal comprising:

(a) applying an input data signal to a pair of parallel channels each comprising the same phase delay, and each clocked using the same clock signal, (b) coupling the phase delayed input data signal to respective inputs of a pair of phase comparators, (c) applying the input data signal to a further channel comprising said same phase delay, and clocking the further channel using said same clock signal, (d) passing the phase delayed input signal from the further channel through a further delay which is a fraction of said same phase delay, and clocking said further delay using said clock signal, (e) applying said further delayed input data signal to another input of one of the phase comparators, (f) applying said input data signal to another phase delay which has said fraction of said same phase delay, to another input of the other of the phase comparators, and (g) providing output signals from each of the phase comparators.

2. A method as defined in claim 1, including creating each said fraction of said same phase delay by passing a signal applied to said further channel through a true single phase clock (TSPC) latch.

3. A method as defined in claim 2, including delaying said input data signal by a predetermined time by passing said input data signal through respective flip flops.

4. A method as defined in claim 3, in which each flip flop is comprised of a series of TSPC latches.

5. A method as defined in claim 3, including applying the input signal to a D input of a p-latch, applying a Q output signal of the p-latch to a D input of an n-latch, the latches forming said flip flops.

6. A method of phase detecting a data input NRZ signal comprising:

(a) applying the data input signal to respective data inputs of a pair of dynamic D-type flip-flops, (b) applying a clock input signal to respective clock inputs of the pair of the dynamic D-type flip-flops, (c) applying the data input signal to a data input of a first latch, and applying a fixed voltage to a clock input of the first latch, (d) coupling the clock input signal to the clock input of a second latch, (e) applying the data input signal to a data input of a third dynamic D-type flip-flop, (f) coupling the clock signal to a clock input of the third dynamic D-type flip flop, and (g) coupling an output of the third dynamic D-type flip flop to the data input of the second latch, (h) coupling an output of each of said pair of said flip flops to a corresponding input of a corresponding first and second XOR gate, (i) coupling the output of the first latch to another input of the first XOR gate and coupling the output of the second latch to another input of the second XOR gate, and (j) providing output signals at outputs of the XOR gates.

7. A phase detector comprising:

(a) first and second exclusive OR (XOR) gates, each having a pair of inputs, (b) a pair of dynamic D-type flip-flops, each having a data input for receiving the same data input signal, and each having a clock input for receiving the same clock input signal, an output of each of the flip flops being coupled to a corresponding input of a corresponding XOR gate, (c) a first and a second latch, each having a data input, a clock input and an output, means for coupling the data input signal to the data input of the first latch and means for coupling the clock signal to the clock input of the second latch, means for coupling a fixed voltage to the clock input of the first latch, the output of the first latch being coupled to another input of the first XOR gate and the output of the second latch being coupled to another input of the second XOR gate, (d) a third dynamic D-type flip-flop comprising a data input for receiving the data input signal, a clock input for receiving the clock signal, and an output coupled to the data input of the second latch, and (e) means for providing output signals at outputs of the XOR gates.

8. A phase detector as defined in claim 7, in which each of the dynamic D-type flip-flops is comprised of a pair of cascade coupled p and n-type latches, said first and second latches being formed of a p or an n-type latch which is similar in type to a final latch in said cascade coupled latches.

9. A phase detector as defined in claim 7, in which each of the dynamic D-type flip-flops is of positive edge triggered type, and is comprised of a p-type latch for receiving the data input signal, the latter p-type latch being cascade coupled to a data input of an n-type latch, the first and second latches each being formed of an n-type latch.

10. A phase detector as defined in claim 9, in which the n-type latch is comprised of a pair of CMOS circuits each comprised of a p-channel field effect transistor (FET) and a first and a second n-channel FET, the source-drain circuits of said p-channel and n-channel FETs being connected in series, the drain of the p-channel FET being connected to a power rail and the source of the second n-channel FET being connected to an opposite polarity power rail, a data input being comprised of gates of the p-channel and second n-channel FETs of a first of the CMOS circuits, a clock input being comprised of gates of the second FETs of both CMOS circuits, the source-drain junction of the p-channel and first n-channel FET of the first CMOS circuit being connected to the gates of the p-channel and second n-channel FET of the second CMOS circuit, and the junction of the source and drain of the p-channel and second n-channel FET of the second CMOS circuit forming an output.

11. A phase detector as defined in claim 9, in which the n-type latch is comprised of a pair of CMOS circuits, a first CMOS circuit of the pair being comprised of a p-channel FET and first and a second n-channel FET all having their source-drain circuits connected in series with the drain of the p-channel FET being connected to a first power rail and the source of the n-channel FET being connected to an opposite polarity power rail, a second CMOS circuit of the pair being comprised of a further p-channel FET and a further n-channel FET, the source-drain circuits of the further p-channel and n-channel FETs being connected in series, with the drain of the further p-channel FET connected to the first power rail and the source of the further n-channel FET connected to the opposite power rail, a gate of the further p-channel FET being connected to a source-drain junction between the p-channel FET of the first CMOS circuit and a gate of the further n-channel FET being connected to the source-drain junction between the first and second n-channel FETs of the first CMOS circuit, gates of the p-channel and second n-channel FETs of the first CMOS circuit forming a data input, a gate of the first n-channel FET of the first CMOS circuit forming a clock input, and a junction between the further said n-channel FETs forming an output.

12. A phase detector as defined in claim 9, in which the p-type latch is comprised of a pair of CMOS circuits each comprised of an n-channel field effect transistor (FET) and a first and a second p-channel FET, the source-drain circuits of the n-channel and p-channel FETs being connected in series, the drain of the n-channel FET being connected to a power rail and the source of the second p-channel FET being connected to an opposite polarity power rail, a data input being comprised of gates of the n-channel and second p-channel FETs of a first of the CMOS circuits, a clock input being comprised of gates of the first p-channel FETs of both CMOS circuits, the source-drain junction of the n-channel and first p-channel FET of the first CMOS circuit being connected to the gates of the n-channel and second p-channel FET of the second CMOS circuit, and the junction of the source and drain of the n-channel and second p-channel FET of the second CMOS circuit forming an output.

13. A phase detector as defined in claim 9, in which the p-type latch is comprised of a pair of CMOS circuits, a first CMOS circuit of the pair being comprised of an n-channel FET and first and second p-channel FET, the source-drain circuits of the p-channel and n-channel FETs being connected in series with the drain of the n-channel FET being connected to a first power rail and the source of the p-channel FET being connected to an opposite polarity power rail, a second CMOS circuit of the pair being comprised of a further n-channel FET and a further p-channel FET, the source-drain circuits of the further n-channel and p-channel FETs being connected in series, with the drain of the further n-channel FET connected to the first power rail and the source of the further p-channel FET connected to the opposite power rail, a gate of the further n-channel FET being connected to a source-drain junction between the n-channel FET of the first CMOS circuit and a gate of the further p-channel FET being connected to the source-drain junction between the first and second p-channel FETs of the first CMOS circuit, gates of the n-channel and second p-channel FETs of the first CMOS circuit forming a data input, a gate of the first p-channel FET of the first CMOS circuit forming a clock input, and a junction between the further n and p-channel FETs forming an output.

* * * * *